United States Patent
Jo et al.

(10) Patent No.: US 10,170,716 B2
(45) Date of Patent: Jan. 1, 2019

(54) METHOD FOR PREPARING ORGANIC FILM AND ORGANIC DEVICE INCLUDING THE SAME

(71) Applicant: GWANGJU INSTITUTE OF SCIENCE AND TECHNOLOGY, Gwangju (KR)

(72) Inventors: Ji Young Jo, Gwangju (KR); Hyeon Jun Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 444 days.

(21) Appl. No.: 14/979,559

(22) Filed: Dec. 28, 2015

(65) Prior Publication Data
US 2016/0201182 A1    Jul. 14, 2016

(30) Foreign Application Priority Data
Jan. 9, 2015    (KR) .................. 10-2015-0003443

(51) Int. Cl.
| | |
|---|---|
| *H01L 51/05* | (2006.01) |
| *B05D 5/12* | (2006.01) |
| *B05D 3/02* | (2006.01) |
| *B05D 1/18* | (2006.01) |
| *H01L 51/56* | (2006.01) |
| *H01L 51/00* | (2006.01) |

(52) U.S. Cl.
CPC ............ *H01L 51/0583* (2013.01); *B05D 1/18* (2013.01); *B05D 3/0254* (2013.01); *B05D 5/12* (2013.01); *H01L 51/56* (2013.01); *H01L 51/0003* (2013.01); *H01L 51/0026* (2013.01); *Y10T 428/24802* (2015.01)

(58) Field of Classification Search
CPC ............ H01L 51/0583; H01L 51/0003; H01L 51/0026; B05D 1/18; B05D 3/0254; B05D 5/12; Y10T 428/24802
See application file for complete search history.

(56) References Cited

U.S. PATENT DOCUMENTS

| | | | | |
|---|---|---|---|---|
| 2005/0061363 | A1* | 3/2005 | Ginley | ................... B82Y 30/00 |
| | | | | 136/252 |
| 2014/0268483 | A1* | 9/2014 | Khan | ...................... G11C 11/22 |
| | | | | 361/301.1 |

FOREIGN PATENT DOCUMENTS

KR    20140093832 A   *  7/2014

OTHER PUBLICATIONS

Lilliu et al., "Dynamics of Crystallization and Disorder During Annealing of P3HT/PCBM Bulk Heterojunctions" Macromolecules, 2011, 44, p. 2725-2734.*

(Continued)

*Primary Examiner* — Gerard Higgins
(74) *Attorney, Agent, or Firm* — Hauptman Ham, LLP

(57) ABSTRACT

Disclosed herein is a method of preparing organic films, including: (1) forming a first organic film including nanorods on a substrate using a first organic solution; (2) introducing a second organic solution at least into spaces between the nanorods of the first organic film; and (3) crystallizing the introduced second organic solution to form a second organic film. The method can provide an organic film having excellent properties in terms of crystallinity and topography.

5 Claims, 11 Drawing Sheets

(56) References Cited

OTHER PUBLICATIONS

[Supportive Materials for Exception to Loss of Novelty] Hyeon Jun Lee et al., Topography engineering of ferroelectric crystalline copolymer film, Organic Electronics, pp. 1-7, on Jan. 19, 2014.

* cited by examiner

METHOD FOR PREPARING ORGANIC FILM AND ORGANIC DEVICE INCLUDING THE SAME

CROSS REFERENCE TO RELATED APPLICATION

This application claims the benefit of Korean Patent Application No. 10-2015-0003443, filed on Jan. 9, 2015, entitled "METHOD FOR PREPARING ORGANIC FILM AND ORGANIC DEVICE INCLUDING THE SAME", which is hereby incorporated by reference in its entirety into this application.

BACKGROUND

1. Technical Field

The present invention relates to organic films, and more particularly, to a method of preparing an organic film having an improved topography, and a ferroelectric capacitor including the same.

2. Description of the Related Art

Since crystalline organic films can be easily fabricated at a low cost, the crystalline organic films have replaced electronic devices which are formed of crystalline inorganic materials having various functionalities resulting from collective phenomena, such as remnant polarization and dielectric constant. However, the problem with organic device applications is that most crystalline organic films exhibit a rough topography due to nanorods developing during crystallization, which results in degradation of electrical properties including poor remnant polarization and dielectric constant.

Such a rough topography of organic films is due to lots of voids having a size of several hundred nanometers between the nanorods. These voids interrupt the propagation of electrons and phonons, such as electron transport and domain wall motion.

Therefore, for application to novel organic electronics with functional organic films embedded therein, there is a need for a low-cost fabrication method which can fill voids in organic films, thereby obtaining a smooth topography while providing enhanced functionality of organic crystalline materials.

BRIEF SUMMARY

It is one aspect of the present invention to provide a method of preparing an organic film having a smooth topography.

It is another aspect of the present invention to provide an organic ferroelectric capacitor including the improved organic film as set forth above.

In accordance with one aspect of the present invention, a method of preparing an organic film includes: (1) forming a first organic thin film including nanorods on a substrate using a first organic solution; (2) introducing a second organic solution at least into spaces between the nanorods of the first organic thin film; and (3) crystallizing the introduced second organic solution to form a second organic thin film.

Step (1) may include spin coating the first organic solution onto the substrate, followed by performing primary annealing of the coated layer.

Step (2) may include dipping the substrate with the first organic thin film formed thereon into the second organic solution.

Step (3) may include performing secondary annealing of at least the introduced second organic solution.

The first organic solution and the second organic solution include P(VDF-TrFE), and the second organic contains a lower wt % of P(VDF-TrFE) than the first organic solution.

The second organic solution may have a temperature of 60° C.

In accordance with another aspect of the present invention, an organic device includes the improved organic film as set forth above.

According to the present invention, there are provided an organic thin film having both good crystallinity and a smooth topography, and an organic device including the same. The solution-based method of the invention allows voids between nanorods to be filled with grains such that a smooth topography can be obtained without deterioration in crystallinity. Such an organic film can be used as a high-gloss rigid film, and applied to manufacture of ferroelectric organic devices.

Figure 2:
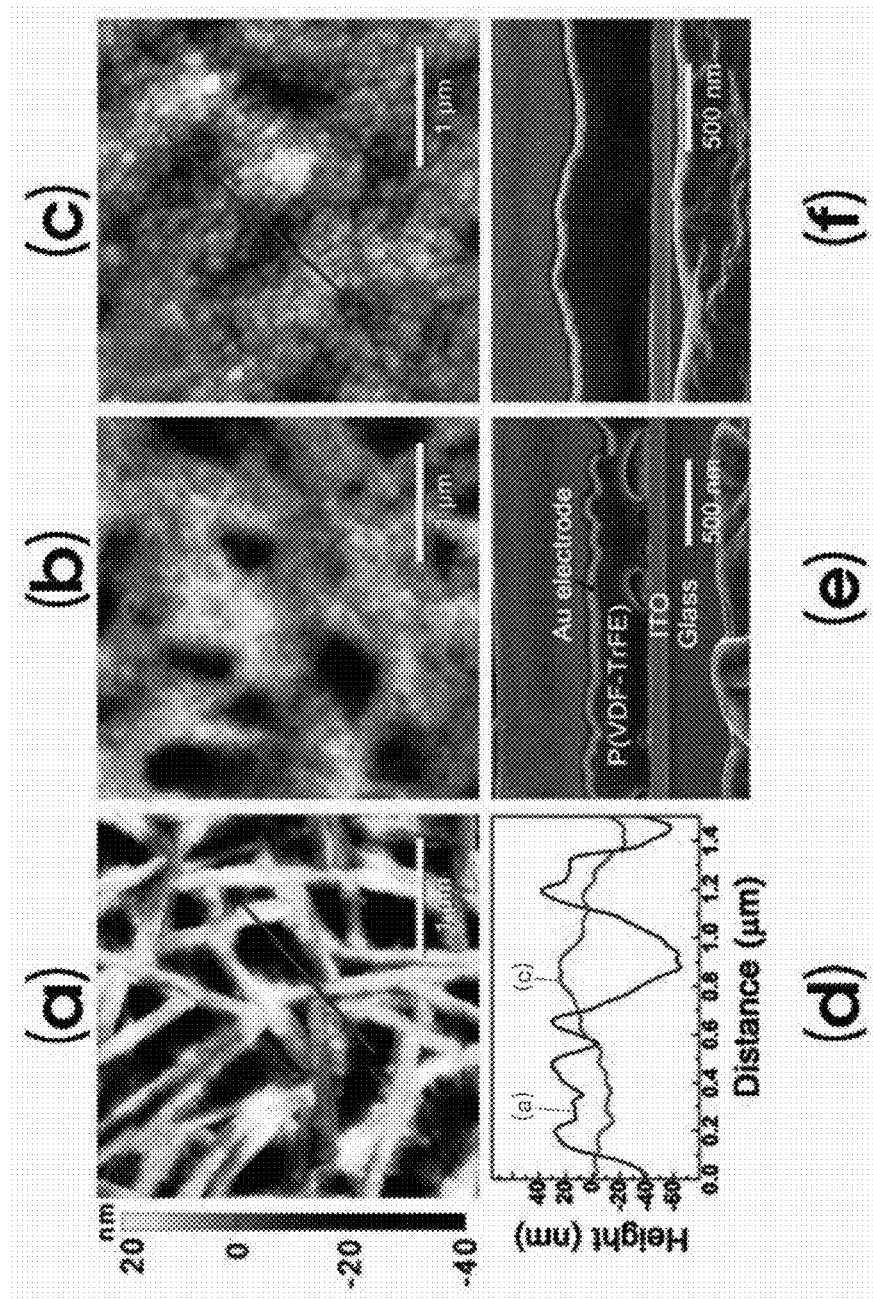

(a) to (c) in FIG. 2 show atomic force microscopy (AFM) images, (d) in FIG. 2 shows a dimension comparison graph, and (e) and (f) in FIG. 2 show changes in topography of a P(VDF-TrFE) film during the aforementioned dipping process included in the method according to the invention.

Figure 1:
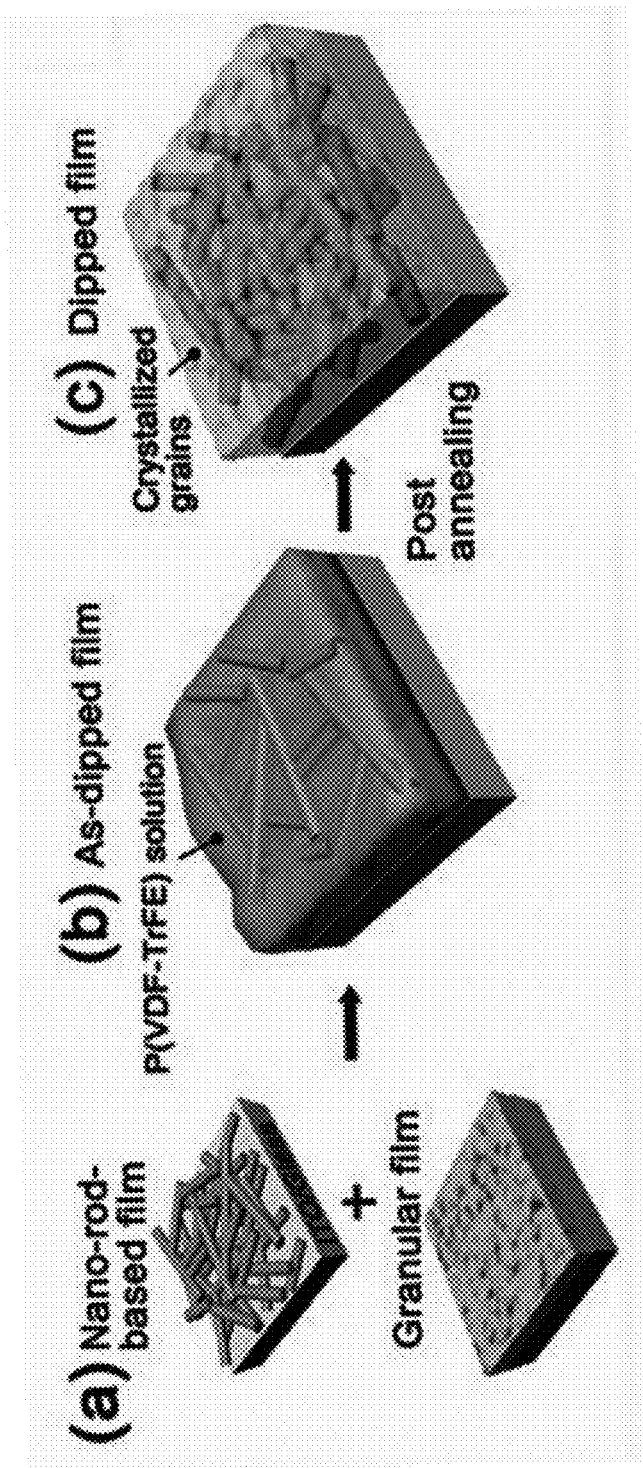
FIG. 1 is a schematic view of a method of preparing organic films according to a preferred embodiment of the present invention.
Figure 3:
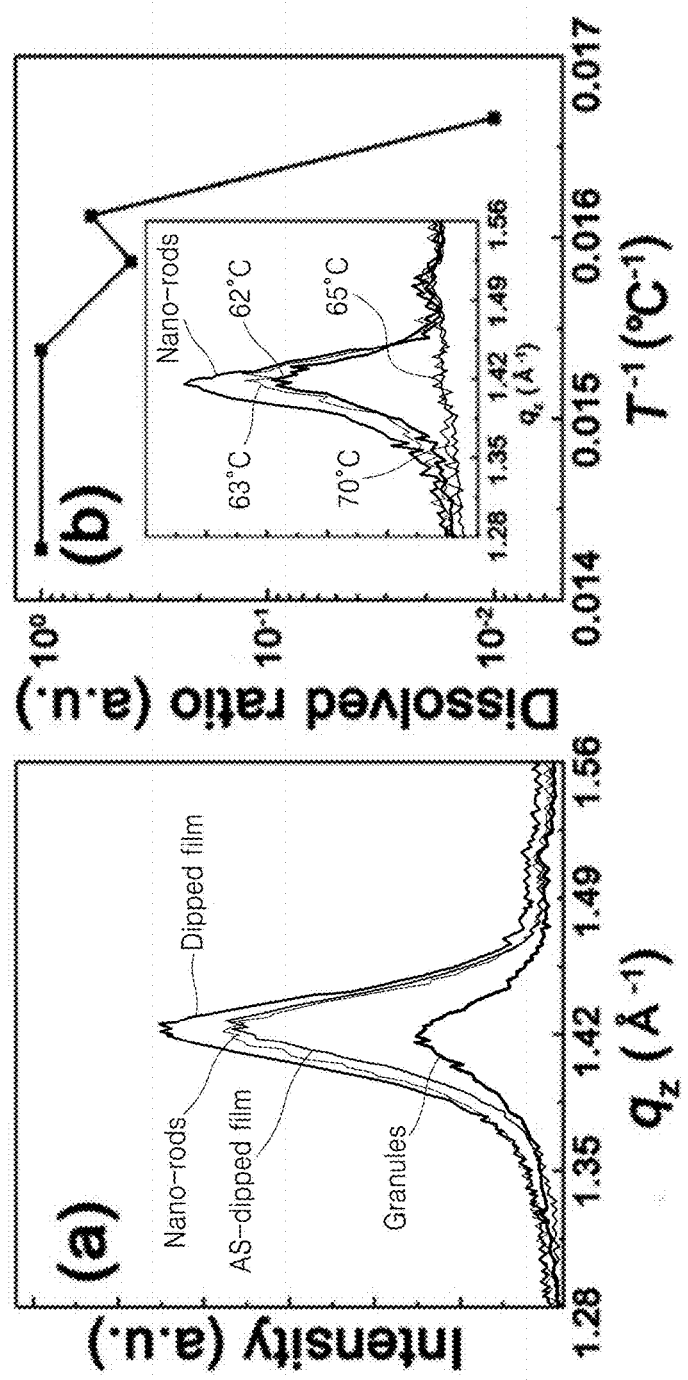

(a) and (b) in FIG. 3 are XRD graphs of dipped films prepared by the dipping process employed by the method according to the present invention as shown in (a) to (c) in FIG. 1.

Figure 4:
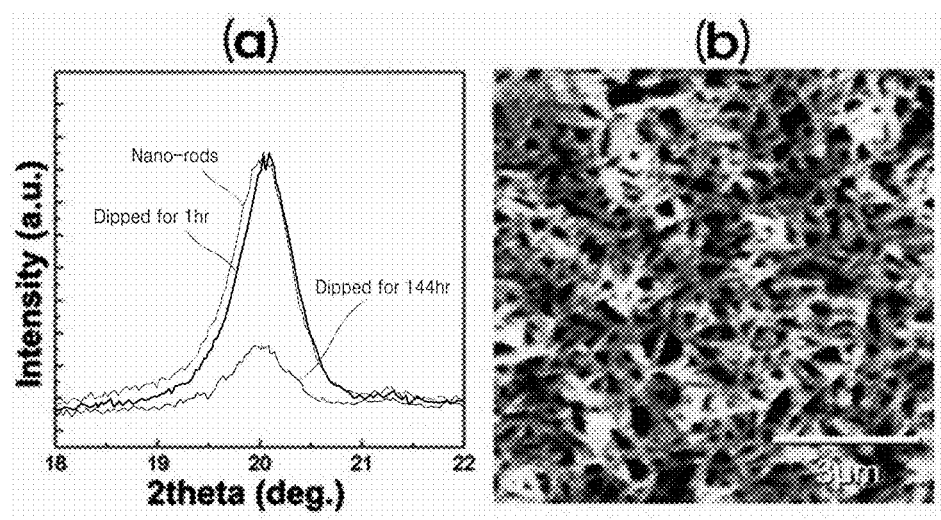

FIG. 4 shows an experimental example of the dipping process of the method according to the present invention, wherein (a) in FIG. 4 is a graph showing XRD results as a function of dipping time and (b) in FIG. 4 is an AFM image of a film after dipping for 1 hour.

Figure 5:
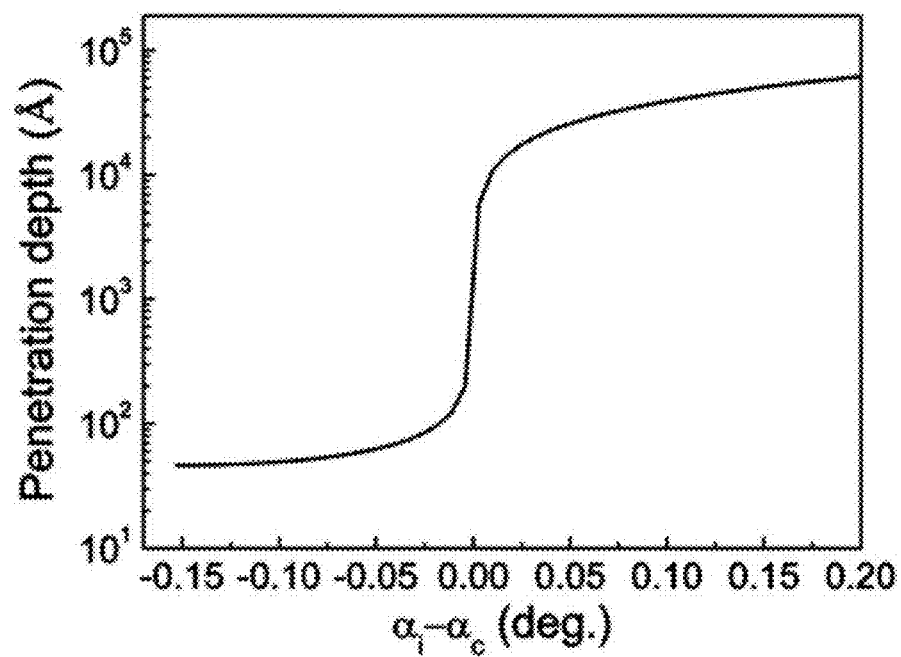

FIG. 5 is a graph showing penetration depth of X-rays into the P(VDF-TrFE) film used in one embodiment of the present invention.

Figure 6:
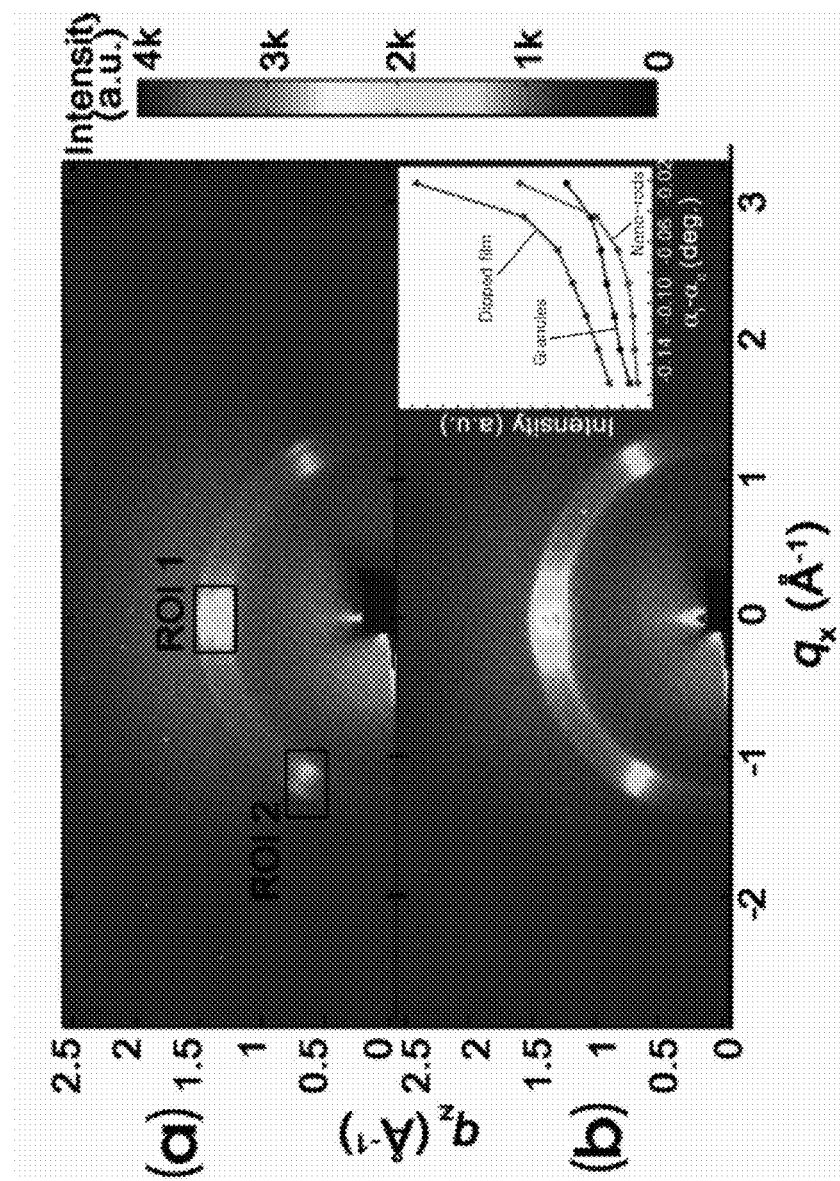

FIG. 6 shows GIXRD images of films used in an experimental example of the present invention, wherein (a) in FIG. 6 is a GIXRD image of a nanorod-based film, and (b) in FIG. 6 is a GIXRD image of a dipped film.

Figure 7:
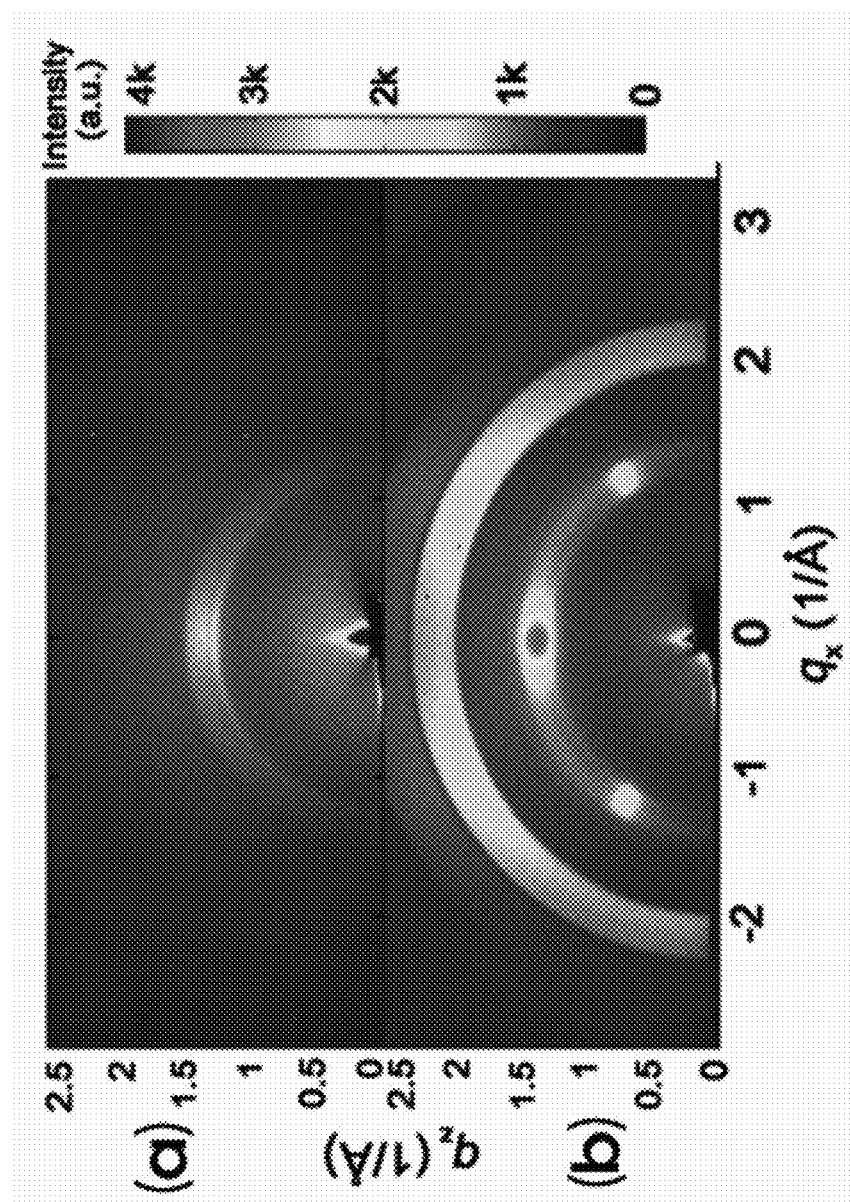

FIG. 7 shows GIXRD images of films used in an experimental example of the present invention, wherein (a) in FIG. 7 is a GIXRD image of a pure granular P(VDF-TrFE) film, and (b) in FIG. 7 is a GIXRD image of a dipped film.

Figure 8:
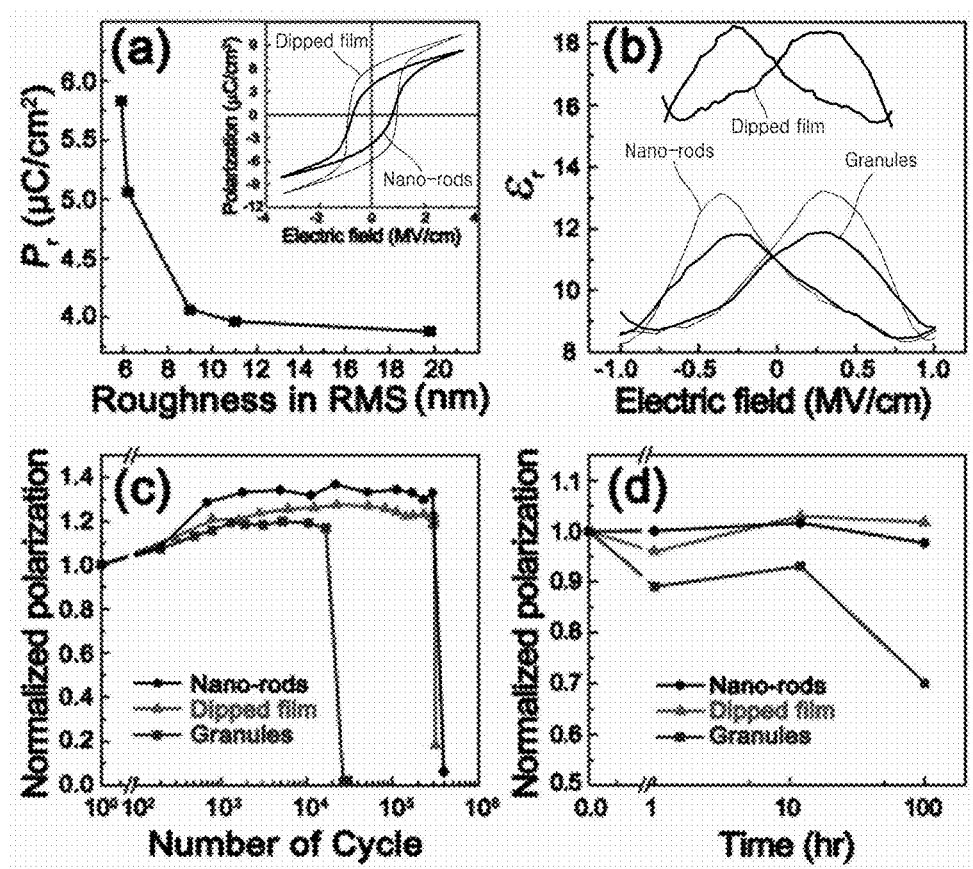

FIG. 8 shows test results for films used in an experimental example of the present invention, wherein (a) in FIG. 8 is a graph showing $P_r$ value as a function of RMS surface roughness, (b) in FIG. 8 shows ε-E curves of the P(VDF-TrFE) film before/after dipping, (c) in FIG. 8 shows fatigue behavior, and (d) in FIG. 8 shows retention properties.

Figure 9:
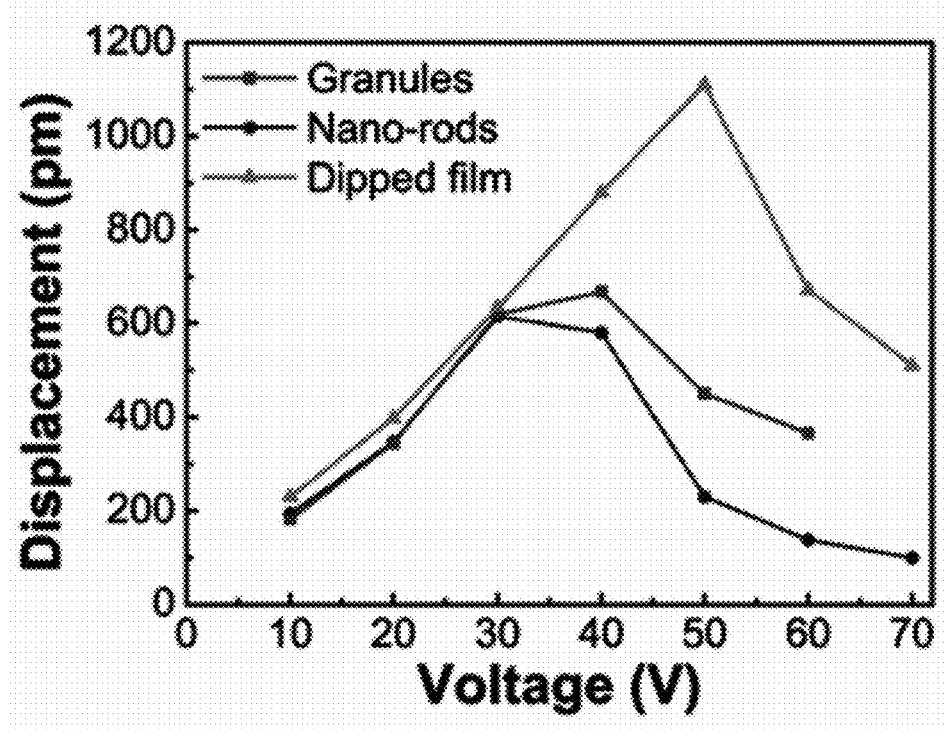

FIG. 9 is a graph showing displacement according to applied voltage for films used in an experimental example of the present invention.

Figure 10:
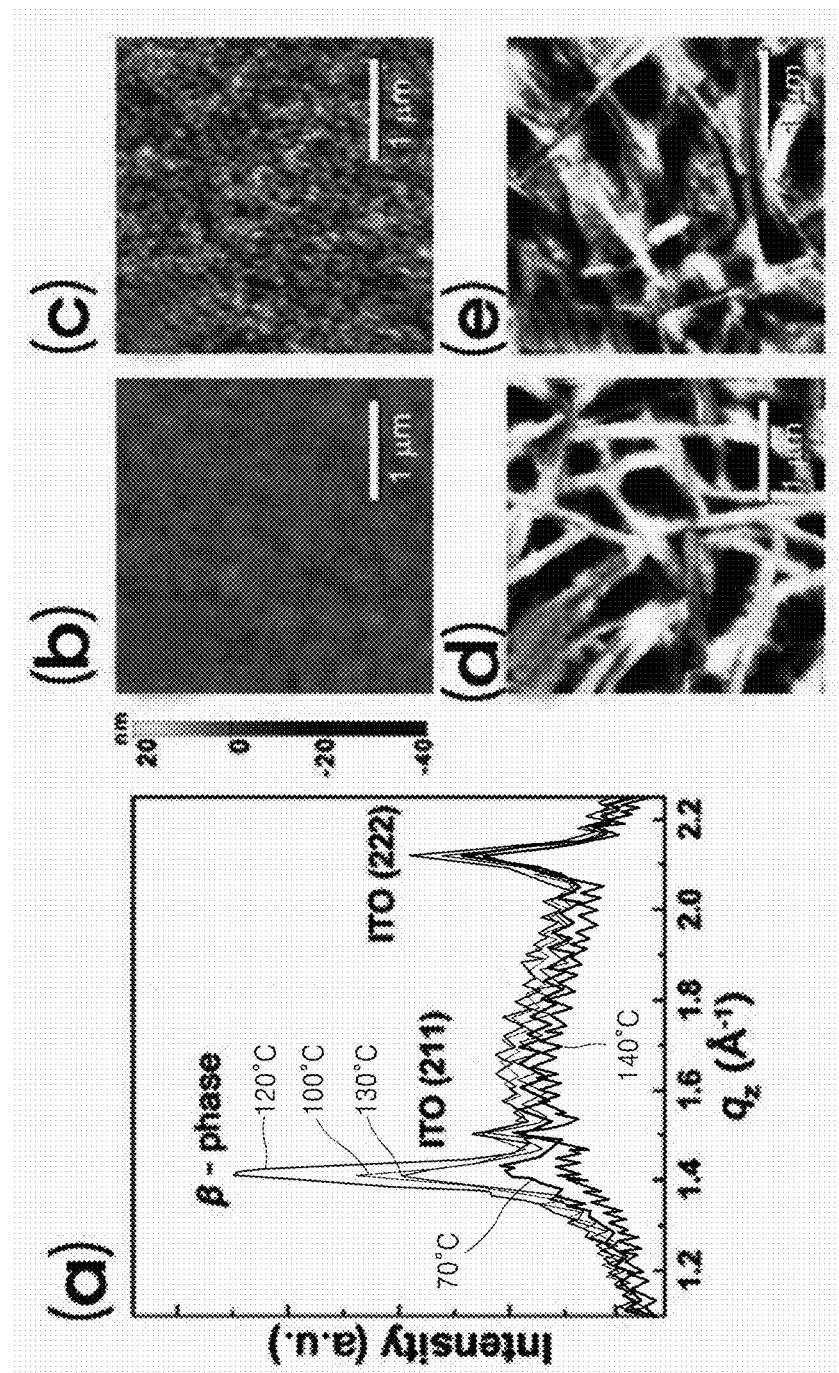

FIG. 10 shows results according to annealing temperature, wherein (a) in FIG. 10 is a graph showing X-ray diffraction of the P(VDF-TrFE) film, and (b) to (d) in FIG. 10 are AFM images.

Figure 11:
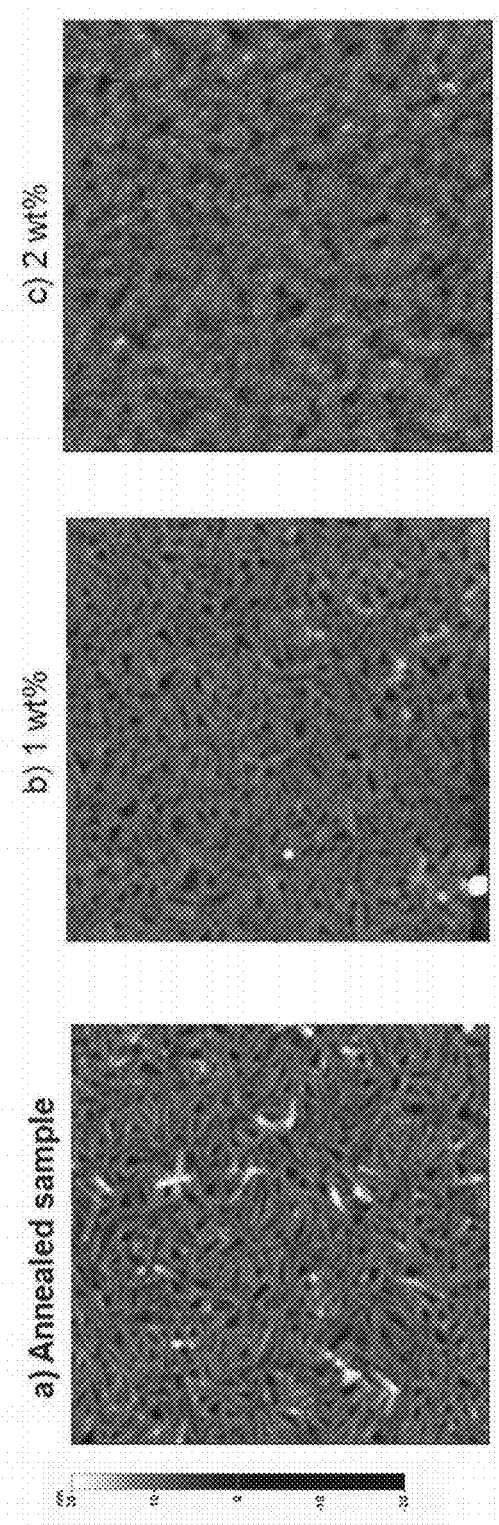

FIG. 11 shows AFM images according to composition of a P(VDF-TrFE) solution used during a dipping process in one embodiment of the method according to the present invention.

DETAILED DESCRIPTION

Hereinafter, exemplary embodiments of the invention will be described in detail with reference to the accompanying drawings. It should be understood that the present invention is not limited to the following embodiments and may be embodied in different ways. Detailed descriptions of functions or features known in the art will be omitted for clarity.

A crystalline poly(vinylidene fluoride-trifluoroethylene) [P(VDF-TrFE)] film having the highest remnant polarization ($P_r$) among organic ferroelectrics (FE) is an ideal system for studying whether physical properties of a P(VDF-TrFE) film can be controlled by topographic properties including the size of voids as well as crystalline properties including phase density. Desirable electrical properties of P(VDF-TrFE) films, depending on these structural properties, include high values of $P_r$ and dielectric constant ($\varepsilon_r$). However, existing studies have only focused on a compromise between topography and crystallinity.

Basically, the topography of P(VDF-TrFE) films composed of either granules having a higher volume fraction of amorphous phase or nanorods of crystalline FE β phase depends on annealing temperature (T). In nanorod-based films, voids exist to a depth close to the total film thickness. In contrast, granular films have no voids, but low-angle grain boundaries, so that root mean square (RMS) surface roughness, which is a measure of surface texture, is reduced down to nanometer scale. Despite a lower volume fraction of FE crystalline β phase, P(VDFTrFE) films with a granular topography exhibit higher FE $P_r$ and $\varepsilon_r$ than P(VDFTrFE) films having a nanorod-based topography. This indicates that drastic change in topography due to formation of nanorods and voids on an entire surface during crystallization has a decisive effect on Pr and $\varepsilon_r$ values of P(VDF-TrFE) films. Voids having a low $\varepsilon_r$ induce voltage drop or increase leakage current by acting as a path thereof, and thus cause reduction in overall $P_r$ and $\varepsilon_r$ of P(VDF-TrFE) films.

The present invention provides a low-cost dipping process which allows voids between nanorods of a P(VDF-TrFE) film capacitor device to be filled by introducing a low wt % solution of P(VDF-TrFE). Such a process allows surface roughness of a nanorod-based film to be reduced to a level as smooth as a granular film while maintaining the crystalline FE β phase having nanorods.

Since it takes only a few hours to sufficiently fill voids, dissolution of nanorods during dipping can be minimized. During dipping, several hundred nanometer sized granules adhere to nanorods to fill voids, whereby FE β phase density of the film increases to 46%, resulting in a smooth topography and sharp interfaces in a capacitor structure of metal/P(VDF-TrFE)/metal. The dipping process employed by the method according to the invention combines advantages of both granular and nanorod-based P(VDF-TrFE) films, including high $P_r$ and $\varepsilon_r$, and improved durability.

Hereinafter, preferred embodiments of a method of preparing organic films according to the present invention will be described in detail with reference to the accompanying drawings.

It should be noted that a method according to the present invention includes dipping as a main process, and, as used herein, "a dipped film" means an organic film to which a method according to the present invention has been applied.

(a) to (c) in FIG. 1 are schematic diagrams of one embodiment of a method according to the invention. Additional grains are introduced into voids between crystalline nanorods to obtain a combined structure of these two components.

First, a P(VDF-TrFE) solution is spin coated onto an (In:Sn)$O_2$ (ITO)/glass substrate, followed by annealing at 120° C., thereby preparing a nanorod-based film (the upper part of (a) in FIG. 1).

Then, the film is dipped into a 2 wt % solution of P(VDF-TrFE) to fill voids (FIG. 1b).

Finally, as shown in (c) in FIG. 1, crystallization is performed by additional spin coating and annealing at 100° C., thereby obtaining a dipped film having additional grains.

(a) to (c) in FIG. 2 show atomic force microscopy (AFM) images, (d) in FIG. 2 shows a dimension comparison graph, and (e) and (f) in FIG. 2 show changes in topography of a P(VDF-TrFE) film during the aforementioned dipping process included in the method according to the invention.

As shown in (a) in FIG. 2, before dipping, there was provided a nanorod-based film composed of nanorods stacked to a thickness of about 200 nm. The void size was much greater than diameters of the nanorods ((a) in FIG. 2).

In addition, as shown in (d) in FIG. 2, the depth of the voids was less than 100 nm. Surface roughness was estimated to have an RMS of 19.8 nm over an area of 5×5 μm² area.

After crystallization subsequent to dipping in a 2 wt % solution of P(VDF-TrFE) at 25° C. for 1 hour, it was observed that grains adhered to the nanorods, as shown in (b) in FIG. 2. After dipping, most of the voids were reduced in size from a few hundred nanometers to tens of nanometers. However, under the aforementioned conditions, all of the voids were not filled with the introduced grains.

Although smaller voids disappeared, several hundred nanometer-sized voids were still observed. After dipping at 25° C., RMS surface roughness was 11 nm.

In order to reduce the size of all the voids, dipping temperature was raised to 60° C. (c) in FIG. 2 shows an AFM image of the P(VDF-TrFE) film after dipping at 60° C.

RMS surface roughness decreased to 5.9 nm, which was lower by a factor of 3 than that of the original nanorod-based film ((a) in FIG. 1). As shown in (d) in FIG. 2, line profiles obtained from AFM images in (a) to (c) in FIG. 2 clearly show that the depth of all the voids decreased to 40 nm after dipping. Reduction in surface roughness is attributed to the P(VDF-TrFE) solution having lower viscosity at higher dipping temperature, whereby the solution sufficiently filled the voids to smooth the topography of the entire film.

(a) and (f) in FIG. 2 clearly show how interfaces between the P(VDF-TrFE) film and two electrodes are affected by dipping.

Before dipping, an Au top electrode deposited on the stacked nanorods had a wrinkled shape, as shown in a sectional image of (e) in FIG. 2. In addition, there were voids at an interface between the film and an ITO bottom electrode, the voids originating from empty spaces between the nanorods on an ITO layer after spin-coating and crystallization.

After dipping, the total thickness of the film increased from 350 nm to about 550 nm, as shown in (f) in FIG. 2. The top electrode on the film became smoother due to changes in topography of the P(VDF-TrFE) film.

(a) and (b) in FIG. 3 are XRD graphs of dipped films prepared by the dipping process employed by the method according to the present invention as shown in (a) to (c) in FIG. 1.

As shown in FIG. 3, with a bulk sensitive technique such as X-ray diffraction, it was confirmed that the dipped film was composed of crystalline nanorods and grains introduced between the nanorods.

(a) in FIG. 3 shows a comparison of diffracted X-ray intensities for a β phase corresponding to the nanorod-based film before dipping, as-dipped film, and dipped film after a complete dipping process including dipping at 60° C. as shown in (a) to (c) in FIG. 1, where qz is a scattering wave vector normal to the surface. The diffraction peaks of a β phase mixed with (110) and (200) reflection of the P(VDF-TrFE) film appeared at qz=1.4 Å$^{-1}$ ((a) in FIG. 3). Although the total thickness of the film changed from 350 nm to 550 nm ((h) and (i) in FIG. 2, a 58% difference), the diffracted X-ray intensity at the β phase with (110) and (200) reflection only increased by 20%. This can be caused by either a partial dissolution of nanorods in a solution during dipping or by predominance of grains having lower crystallinity than the nanorods. However, the as-dipped film exhibited almost the same diffracted X-ray intensity as that of the nanorod-based film prior to further crystallization ((a) in FIG. 3). This indicates that the nanorod-based film did not suffer from any significant dissolution during dipping in the solution for 1 hour. Crystalline β phase nanorods were negligibly dissolved at a temperature as low as 60° C., which means that a dissolving process is sufficiently slow in the solution according to the invention to allow introduction of the solution between the nanorods.

The dissolved ratio of nanorods depending upon dipping conditions such as time amount and temperature was quantitatively analyzed while monitoring changes in diffracted X-ray intensity for the β phase normal to a surface of the nanorod-based film ((b) in FIG. 3).

After dipping for a longer amount of time (144 hours), the diffracted intensity of the as-dipped film decreased by a factor of 3 ((a) in FIG. 4). When dipping time was as short as 1 hour, the structure of nanorods was maintained even in a pure solvent, which was confirmed through AFM images ((b) in FIG. 4). Dissolving process was much more dependent upon dipping temperature than dipping time. The insert of (b) in FIG. 3 is an Arrhenius-type plot of dissolved ratio as a function of changes in dipping temperature T. In a narrow range of dipping temperature from 60° C. to 65° C., dissolved ratio abruptly increased, which indicates complete dissolution of crystalline nanorods ((b) in FIG. 3). Thus, it could be seen that dipping at 60° C. for 1 hour was the optimal condition for maintaining the structure of the crystalline nanorods of the P(VDF-TrFE) film.

In order to investigate the effect of the additionally introduced grains on topography, surface-sensitive X-ray diffraction measurement, specifically grazing incidence X-ray diffraction (GIXRD), was conducted. This allows selection of an X-ray penetration depth ($d_p$) much smaller than the thickness of grains. When incident angle ($a_i$) of X-rays on the film was less than or equal to a critical angle ($a_c$), $d_p$ could be confirmed using exponential absorption of X-rays in a direction normal to the film surface. When $a_i$-$a_c$=0.022°, $d_p$ for a P(VDF-TrFE) material was 10 nm (FIG. 5).

(a) and (b) in FIG. 6 shows a reciprocal space map of a P(VDF-TrFE) film constructed from GIXRD images of the nanorod-based film and the dipped film when $a_i$-$a_c$=0.022°. A powder diffraction pattern from ITO was not observed since X-rays could penetrate the films by only 10 nm and could not reach the ITO bottom electrode ((a) in FIG. 7).

The dipped film exhibited preferential orientations of (110) and (200) in the β phase in a direction normal to the film surface and in a direction tilted 60° with respect to the surface, which were depicted as ROI1 and ROI2 in (a) and (b) in FIG. 6, respectively. For the dipped film, the integrated intensity of ROI1 was 1.08×10$^6$, whereas, for the nanorod-based film and the granular film, the integrated intensity of ROI1 was 7.4×10$^5$ and 5.9×10$^5$ cps, respectively. The phase density of the dipped film increased by 46% and 85% as compared with that of the nano-rod-based and granular films, respectively. Regardless of $d_p$ value, the additionally introduced grains contributed to intensity increase although the nanorods were retained on an upper surface of the dipped film (inset of (b) in FIG. 6). This differed from 20% increase over the entire film based on the bulk-sensitive X-ray diffraction results as shown in (a) in FIG. 3. The reason for the large difference in ratio of integrated intensity between the upper surface and the bulk was that the additionally introduced grains filled the voids between the nano-rods mostly from the upper surface, thereby contributing to increase in density of the overall crystalline phase.

Both topography and crystallinity of the film can affect FE polarization of P(VDF-TrFE) and device stability. The inset of (a) in FIG. 8 shows P-E hysteresis loops before/after dipping at 60° C. Based on P-E hysteresis loops of various dipped and nanorod-based P(VDF-TrFE) films (partially shown in the inset of (a) in FIG. 8), (a) in FIG. 8 shows a plot of $P_r$ as a function of RMS surface roughness, as a measure of topography. When the RMS surface roughness decreased from 19.8 nm to 5.9 nm after optimal dipping, the $P_r$ value increased from 3.9 µC·cm$^{-2}$ to 6.2 µC·cm$^{-2}$ (58%). This clearly shows that reduction in surface roughness is closely related to increase in $P_r$ value of the P(VDF-TrFE) film.

(b) in FIG. 8 shows $ε_r$-E curves of the P(VDF-TrFE) film before/after dipping. After dipping, the $ε_r$ value increased dramatically from 8 to 14 (75%) at an E value of 0.75 MV/cm$^{-1}$. The reason for this abrupt increase in $ε_r$ is that molecular dipoles of the dipped film have neither continuity of polarization nor macroscopic alignment of backbones due to the stack structure of granules/nanorods. Large rotation of dipoles along an applied electric field thus can induce a high $ε_r$, similarly to Pb(Zr,TiO)$_3$, at a morphotropic phase boundary. Despite increase in Pr and $ε_r$, piezoelectric coefficient ($d_{33}$,eff) values of the granular, nanorod-based, and dipped films were measured to be 21.9 pm/V, 21.05 pm/V, and 22.4 pm/V, respectively. A relatively high mechanical clamping effect of the substrate accompanied by improved film density and high adhesion can restrict increase in displacement of the dipped film for a given voltage. Improved density and smoothness, nevertheless, can reduce local and overall failures due to electrical breakdown, whereby the film can exhibit superior electromechanical performance at high voltage (E) (FIG. 9).

In order to quantify characteristics of the dipped film as an FE device, fatigue and retention properties of the film before/after dipping were compared ((b) to (d) in FIG. 8). The nanorod-based film exhibited a fatigue resistance approximately 10 times higher than the granular film ((c) in FIG. 8). Retention properties of the nanorod-based film were also better by about 30% than the granular film in a retention test at 60° C. for 100 hours. In fatigue and retention tests, the dipped film according to the invention composed of nanorods and grains showed similar behavior to that of the nanorod-based film. Defect sites of the amorphous granular film can play a critical role in domain wall pinning, which is one of the main reasons for such FE fatigue and retention behaviors. As a result, the dipped film according to the present invention brings out the best of both the granular film having high $P_r$ and the nanorod-based film having better properties in terms of fatigue and retention behaviors.

FIG. 11 includes AFM images obtained in the dipping process employed by the method according to the invention, while varying composition of the P(VDF-TrFE) solution. Here, dipping was performed at 60° C. for 1 hour. As shown in FIG. 11, changes in morphology were insignificant when using a 1 wt % or less solution of P(VDF-TrFE), whereas changes in morphology were significant when using a 2 wt % solution of P(VDF-TrFE).

The dipping process employed by the solution-based fabrication method according to the invention may be used to realize a smooth topography of a crystalline organic film. Experimental results of the invention show that FE properties, such as $P_r$, $\varepsilon_r$, piezoelectric properties, and fatigue and retention behaviors of organic P(VDF-TrFE) films are related to both topography and crystallinity. A crystalline structure of nanorods was successfully maintained after performing the method according to the invention including dipping in a 2 wt % solution of P(VDF-TrFE) and subsequent crystallization. Additionally introduced grains were found to adhere to nanorods without severe dissolution of the nanorods during dipping at 60° C. for 1 hour. After dipping, voids between the crystalline nanorods were filled with the grains, which resulted in increase in crystalline phase density, while allowing enhancement in surface roughness, dielectric, ferroelectric, and piezoelectric properties. The crystalline organic film applied to electronic devices can provide both a smooth surface topography on a nanometer scale and high crystallinity.

REFERENCE FOR EXPERIMENTAL EXAMPLES

Preparation of Copolymer Film

In experiment, a pellet-type P(VDF-TrFE) copolymer containing 50% of TrFE (Piezotech, France) was used. Non-toxic MEK ($C_4H_8O$, 99.5%, Sigma-Aldrich Corporation) was used as a solvent for the copolymer. The copolymer was dissolved at 80° C. for 1 hour. A 5 wt % solution of P(VDF-TrFE) was spin coated onto an ITO/glass substrate at a spin speed of 3500 rpm for 30 seconds, thereby preparing a uniform film. The coated P(VDF-TrFE) film was subjected to annealing at 120° C. for 1 hour using a heating tube to transform the film into a high crystallinity structure including nanorods. A crystalline β phase was confirmed by X-ray diffraction using CuKa radiation from an Advanced D8 diffractometer (Bruker Corporation, Germany).

Dipping Process

In order to obtain a smooth surface, the high crystalline P(VDF-TrFE) copolymer film was dipped into a 2 wt % solution of P(VDF-TrFE), while varying dipping time and dipping temperature. After dipping, each sample was subjected to spin coating again at 3500 rpm for 30 seconds, followed by annealing at 100° C., thereby crystallizing the additionally introduced solution on the film.

Morphological Study

The surface topography of the film was observed via AFM (Park XE-100, Park Systems, Korea) in a non-contact mode. RMS roughness was calculated using a PEI program provided by Park Systems. Sectional images were obtained using FIB/SEM (Helios NanoLab 660, FEI, USA) to compare morphological results.

GIXRD

GIXRD was performed using monochromatic X-rays (10 keV) on a 5D beam line at the Pohang Accelerator Laboratory. Diffracted X-rays were detected using a pixel array detector (Pilatus 100 k, Dectris Ltd., Switzerland).

Electrical and Piezoelectric Properties of Film Capacitor Device

To measure ferroelectric properties using a metal-ferroelectric material-metal (MFM) structure, a 100 nm thick Au top electrode having a size of 70×70 μm$^2$ was deposited through a shadow mask using an e-beam evaporator. P-E magnetic hysteresis loops, fatigue, and retention of the P(VDF-TrFE) film were measured using a commercial ferroelectric measurement apparatus (Precision LC, Radiant Technology). A 100 Hz triangular wave was applied to measure P-E loops and fatigue. A retention test was conducted using pulses with a width of 5 ms. Between writing and reading pulses, the film was baked at 60° C. on a hot plate. Piezoelectric properties were measured using a laser scanning vibrometer (OFV-3001-SF6, PolyTech GmbH).

Although some embodiments have been described, it will be apparent to those skilled in the art that these embodiments are given by way of illustration only, and that various modifications, changes, alterations, and equivalent embodiments can be made without departing from the spirit and scope of the invention. The scope of the invention should be limited only by the accompanying claims and equivalents thereof.

What is claimed is:

1. A method of preparing an organic film, comprising:
   (1) forming a first organic film including nanorods on a substrate using a first organic solution;
   (2) introducing a second organic solution at least into spaces between the nanorods of the first organic film; and
   (3) crystallizing the introduced second organic solution to form a second organic film,
   wherein the first organic film and the second organic film together form the organic film, and
   wherein the first organic solution and the second organic solution comprise P(VDF-TrFE), and the second solution contains a lower wt % of P(VDF-TrFE) than the first organic solution.

2. The method according to claim 1, wherein Step (1) comprises spin coating the first organic solution onto the substrate to form a coated layer, followed by performing primary annealing of the coated layer.

3. The method according to claim 2, wherein Step (2) comprises dipping the substrate with the first organic film formed thereon into the second organic solution.

4. The method according to claim 1, wherein Step (3) comprises performing annealing of at least the introduced second organic solution.

5. The method according to claim 1, wherein the second organic solution has a temperature of 60° C.

* * * * *